United States Patent
Brinz

(10) Patent No.: US 7,025,499 B2
(45) Date of Patent: Apr. 11, 2006

(54) DEVICE FOR TESTING A MATERIAL THAT CHANGES SHAPE WHEN AN ELECTRIC AND/OR MAGNETIC FIELD IS APPLIED

(75) Inventor: Thomas Brinz, Bissingen Unter der Teck (DE)

(73) Assignee: Robert Bosch GmbH, Stuttgart (DE)

( * ) Notice: Subject to any disclaimer, the term of this patent is extended or adjusted under 35 U.S.C. 154(b) by 446 days.

(21) Appl. No.: 10/032,973

(22) Filed: Oct. 24, 2001

(65) Prior Publication Data

US 2002/0109505 A1 Aug. 15, 2002

(30) Foreign Application Priority Data

Oct. 24, 2000 (DE) .......................... 100 52 631

(51) Int. Cl.
  *G01N 25/16* (2006.01)
  *G01J 5/00* (2006.01)
  *G01K 13/00* (2006.01)

(52) U.S. Cl. ............................. 374/56; 374/55; 374/45; 374/121; 374/142

(58) Field of Classification Search .................. 374/43, 374/45, 55, 56, 121, 31, 32, 33, 142, 6, 7, 374/46; 356/601, 608; 324/451, 452
See application file for complete search history.

(56) References Cited

U.S. PATENT DOCUMENTS

| | | | | |
|---|---|---|---|---|
| 3,681,602 A | * | 8/1972 | Teale ......................... 250/353 |
| 4,065,308 A | * | 12/1977 | Bergen ....................... 430/50 |
| 4,351,615 A | * | 9/1982 | Vettori de Almeida Rodrigues ...... 374/56 |
| 4,516,021 A | * | 5/1985 | Taylor .................... 250/227.17 |
| 4,636,969 A | * | 1/1987 | Kyoden et al. ............. 702/155 |
| 4,653,109 A | * | 3/1987 | Lemelson et al. .......... 382/107 |
| 4,999,570 A | * | 3/1991 | Ehrler ......................... 324/96 |
| 5,055,648 A | * | 10/1991 | Iceland et al. ............... 219/601 |
| 5,121,987 A | * | 6/1992 | Berg .......................... 356/496 |
| 5,188,286 A | * | 2/1993 | Pence, IV .................... 236/1 F |

(Continued)

FOREIGN PATENT DOCUMENTS

| | | | | |
|---|---|---|---|---|
| DE | 4211131 | A1 | * | 10/1993 |
| EP | 0 867 699 | | | 9/1998 |
| JP | 61138152 | A | * | 6/1986 |
| JP | 63175756 | A | * | 7/1988 |
| JP | 01012587 | A | * | 1/1989 |
| JP | 01282454 | A | * | 11/1989 |
| JP | 01314957 | A | * | 12/1989 |
| JP | 02198347 | A | * | 8/1990 |
| JP | 02206748 | A | * | 8/1990 |
| JP | 03122544 | A | * | 5/1991 |
| JP | 03211449 | A | * | 9/1991 |
| JP | 03245048 | A | * | 10/1991 |
| JP | 04366744 | A | * | 12/1992 |
| JP | 07077552 | A | * | 3/1995 |
| JP | 09325165 | A | * | 12/1997 |
| JP | 11153556 | A | * | 6/1999 |
| JP | 2001264373 | A | * | 9/2001 |
| SU | 1474531 | | | 4/1989 |

OTHER PUBLICATIONS

J. and H. Krautkrämer, "Werkstoffprufung mit Ultraschall", 5$^{th}$ Edition, 1986, pp. 157–158.

*Primary Examiner*—Gail Verbitsky
*Assistant Examiner*—Mirellys Jagan
(74) *Attorney, Agent, or Firm*—Kenyon & Kenyon

(57) ABSTRACT

A device for testing a material that changes shape when an electric and/or magnetic field is applied, in particular a piezoactive material, having a generator to generate an electric field and/or a magnetic field is described. This permits a rapid characterization of the material and at the same time can be implemented with a much lower structural complexity. This is achieved by the fact that at least one thermal sensor is provided for detecting a change in temperature of the material.

24 Claims, 2 Drawing Sheets

U.S. PATENT DOCUMENTS

| | | | |
|---|---|---|---|
| 5,196,377 A | * 3/1993 | Wagner et al. | 438/384 |
| 5,209,569 A | * 5/1993 | Fujiwara et al. | 374/55 |
| 5,262,345 A | * 11/1993 | Nasser et al. | 438/203 |
| 5,343,150 A | * 8/1994 | Nakahata et al. | 324/316 |
| 5,441,343 A | * 8/1995 | Pylkki et al. | 374/137 |
| 5,463,464 A | * 10/1995 | Ladewski | 356/601 |
| 5,479,261 A | * 12/1995 | Hansen | 356/628 |
| 5,594,240 A | * 1/1997 | Weiss | 250/227.23 |
| 5,601,364 A | * 2/1997 | Ume | 374/57 |
| 5,672,848 A | * 9/1997 | Komorita et al. | 174/260 |
| 5,684,297 A | * 11/1997 | Tardy | 250/227.14 |
| 5,745,238 A | * 4/1998 | Long et al. | 356/601 |
| 5,946,102 A | * 8/1999 | Holcomb | 356/417 |
| 5,984,524 A | * 11/1999 | Teshirogi et al. | 374/55 |
| 6,004,617 A | * 12/1999 | Schultz et al. | 427/8 |
| 6,047,600 A | * 4/2000 | Ottosson et al. | 73/597 |
| 6,134,955 A | * 10/2000 | Han et al. | 73/105 |
| 6,184,504 B1 | * 2/2001 | Cardella | 219/513 |
| 6,208,418 B1 | * 3/2001 | Maris | 356/388 |
| 6,297,579 B1 | * 10/2001 | Martin et al. | 310/330 |
| 6,359,372 B1 | * 3/2002 | Dujari et al. | 310/328 |
| 6,373,570 B1 | * 4/2002 | McFarland et al. | 356/364 |
| 6,381,716 B1 | * 4/2002 | Mullins et al. | 714/724 |
| 6,597,083 B1 | * 7/2003 | Gallmeyer et al. | 310/315 |

* cited by examiner

DEVICE FOR TESTING A MATERIAL THAT CHANGES SHAPE WHEN AN ELECTRIC AND/OR MAGNETIC FIELD IS APPLIED

FIELD OF THE INVENTION

The present invention relates to a device for testing a material that changes shape when an electric and/or magnetic field is applied.

BACKGROUND INFORMATION

The piezoelectric effect, as it is called, has been known since 1880 and was discovered by J. and P. Curie. Such materials develop an electric charge in deformation under mechanical stress or they change their shape when an electric field is applied. The latter is also known as the "inverse piezoelectric effect" and is utilized in a variety of ways, especially in technology.

Some naturally occurring piezoelectric crystals such as quartz as well as a wide variety of synthetically produced ceramic materials such as titanates or niobates have good piezoelectric properties. Plastics having piezoelectric properties are also conventional. For example, the piezoelectric effect of the synthetic polymer polyvinylidene fluoride (PVDF) exceeds that of crystalline quartz by a factor of three to five.

So far, the change in shape of samples has been measured in the development of piezoactive materials. However, one disadvantage here is that minimal changes in shape are measured, especially when using comparatively small samples. This leads to comparatively slow, complicated and uneconomical methods of testing such materials, so that corresponding devices and methods can be used only to a limited extent, e.g., in the case of numerous material samples.

SUMMARY OF THE INVENTION

An object of the present invention, however, is to propose a device for testing such materials which will permit a rapid characterization of the material and at the same time can be implemented with a much lower structural complexity.

Accordingly, a device according to the present invention is characterized in that at least one thermal sensor is provided for detecting a change in temperature of the material.

Applying an electric and/or magnetic field causes a change in the corresponding field, which leads in particular to a certain heating of these materials. With the help of a thermal sensor according to the present invention, it is possible in an advantageous manner to detect the change in temperature of the material. This permits a comparatively rapid characterization of a material, in particular an initial characterization in the development of a material, without any great effort.

According to the present invention, an initial characterization which is especially favorable economically can also be implemented especially with numerous different materials. For example, on the basis of this qualitative test, it is possible to make a selection of materials with and without corresponding properties, so that the number of materials optionally to be investigated further can be reduced significantly in an advantageous manner.

The thermal sensor is advantageously designed as a radiation detector for electromagnetic radiation. In this way, the thermal sensor can operate by a non-contact principle. In addition, a very rapid measurement can be performed in this way. Such a radiation detector is provided to advantage in the field of thermal radiation, especially infrared radiation, because the greatest possible changes in signal are to be expected here with a change in temperature, and thus a good measurement accuracy is possible. Such a thermal sensor can be implemented with the help of an infrared thermal camera, for example.

The thermal sensor is preferably designed to have local resolution, so that in particular areas of material that have been heated to different extents locally can be detected. In an advantageous manner, optical elements can be used here for focusing, for example, so the resolution of an optimum recording unit can be improved.

As an alternative, however, non-optical thermal sensors, e.g., bimetals or the like, can also be used. According to the present invention, recording units having local resolution are also advantageous in these embodiments.

In an advantageous refinement of the present invention, an imaging unit is provided, so that an imaging record of the material to be tested can be obtained. For example, a photographic unit or a camera unit may be used here, in particular having at least one optical lens. Preferably commercial imaging units, optionally with minor modifications, may also be provided here.

The imaging unit according to the present invention may also be used in an advantageous manner for detecting and analyzing a change in shape or size, thus permitting a method of testing the material that is especially favorable economically.

In all the embodiments of the present invention, a uniform detection of a test surface of the material is preferably implemented. This can be accomplished in particular by using an almost parallel arrangement of the thermal sensor with respect to the test surface of the material.

In an advantageous refinement of the present invention, a unit is provided for varying the electric and/or magnetic field. In this way, the material to be tested can be heated to a particularly great extent, e.g., through a comparatively rapid change in the electric and/or magnetic field, so that in addition to materials having especially marked shape-changing properties, materials having less pronounced shape-changing properties can also be detected in particular. At the same time, a thermal sensor having a lower sensitivity can also be used as a result of this measure, which can in turn improve the use of a device according to the present invention from an economic standpoint.

A unit is preferably provided for periodically varying the electric and/or magnetic field. This makes it possible to produce a sinusoidal, square-wave or similar characteristic of the periodic change in the electric and/or magnetic field applied to the material, e.g., by using a commercial generator.

The material to be tested is advantageously arranged on a substrate. This guarantees that comparatively small samples of material in particular can also be handled by using an appropriate substrate carrier. Similarly, small samples of material are sufficient for an initial characterization and optionally permit an advantageous method of producing the material samples including the substrate.

In another embodiment of the present invention, a temperature control of the substrate is provided. In this way, it is possible to set a constant temperature of the substrate, for example, so that a change in temperature of the substrate cannot have a negative effect on testing of the material. The substrate here can be thermostatically regulated by a climate chamber, a heating device or a cooling device and/or the like. Optionally, a substrate of suitably large dimensions and having comparatively good thermal conductivity properties will also permit adequate temperature control.

In an advantageous refinement of the present invention, electric contacting of the material to be tested is provided. For example, electric contacting can be implemented by a method of applying the material, e.g., by sputtering, by gluing a layer of metal or by similar methods. Applying an electric and/or magnetic field to the material to be tested can be implemented without any great complexity by using the contacting method according to the present invention.

A detection unit is preferably provided for detecting the portion of the heating of the material attributed to the electric current. It is guaranteed here that only the portion of heating of the material that can be attributed to the electric current can be detected. This permits compensation for the heating of the material caused by the electric current. In a preferred embodiment, an analyzer unit is used for compensation of the temperature increase, detected by the thermal sensor in the material to be tested, with the portion of the heating of the material attributed to the electric current. In this way, only the change in temperature of the material caused by applying the electric and/or magnetic field can be detected, so that possible mistakes in measurement by using the thermal sensor can be prevented in an advantageous manner.

In another embodiment of the present invention, at least two different test areas are provided on the substrate, these test areas optionally having different materials. In this way, comparatively rapid testing of a wide variety of materials can be implemented with a device according to the present invention in an advantageous manner.

Preferably the different test areas can optionally be detected with just one photograph by the imaging unit according to the present invention. In particular, the advantageous imaging properties of this unit permit a rapid characterization of the individual test areas here.

In an advantageous refinement of the present invention, numerous different test areas having a similar composition are provided. For example, corresponding materials are produced on a substrate by using the conventional methods of combinatory chemistry.

In an advantageous manner, numerous different test areas are arranged in a grid pattern on the substrate. This additionally improves the rapid characterization of individual test areas, in particular on the basis of a systematization of the arrangement of test areas, which is comparatively simple to implement.

A measurement unit is advantageously provided for measuring the change in shape of the test object. This guarantees that the material to be tested or the different test areas can also be tested quantitatively, in particular according to detection of the change in temperature of the material according to the present invention. For example, this permits a classification of materials on the basis of changes in shape which occur to varying degrees.

Preferably an optical measurement unit is provided for detecting changes in shape and/or length. In an advantageous manner, an incident beam of light striking the test object at a predetermined angle and reflected on the object can be in particular by electric contacting applied to the material to be tested, so that a change in shape of the material leads to a change in deflection of the reflected beam of light or laser beam. By analyzing the deflection of the beam of light or the laser beam, the change in length of the material to be tested can be determined.

By using the imaging unit according to the present invention, the change in shape of the material can also be quantified. A three-dimensional measurement of the material to be tested can be implemented here by using an advantageous combination of the imaging unit with measurements of the change in shape and/or length as described above.

DETAILED DESCRIPTION

Figure 1:
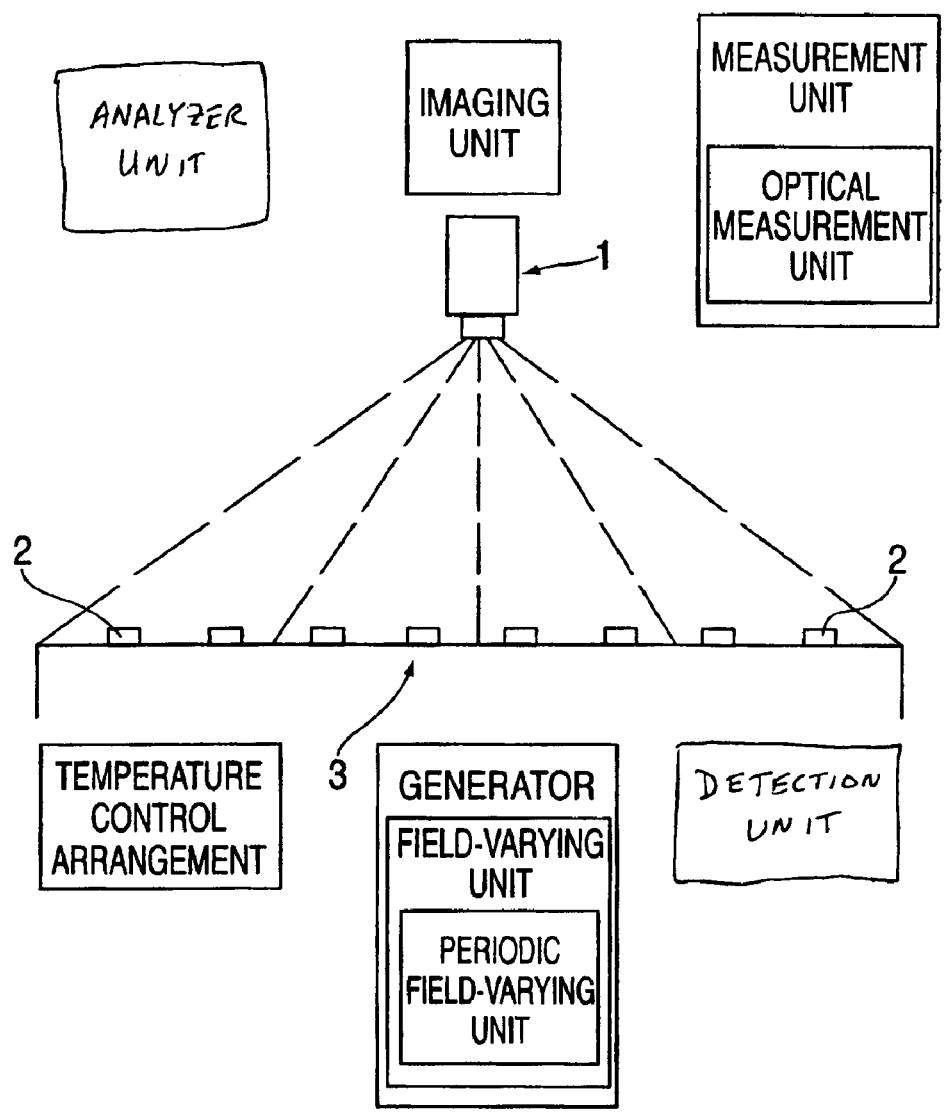
FIG. 1 shows a schematic diagram of a device according to the present invention.

FIG. 1 shows a schematic diagram of a device according to the present invention, where a test material 2 that changes shape when an electric field is applied is tested by using an infrared thermal camera 1. Numerous different material samples 2 are arranged here in a grid pattern on a substrate 3. Test materials 2 are preferably ceramics, plastics or the like which are tested with regard to their piezoactive property. IR thermal camera 1 detects the entire area of substrate 3.

Substrate 3 is thermostatically regulated on a heating plate or in a climate chamber in a manner not discussed in further detail here.

Substrate 3 may be made of aluminum oxide, for example, or it may be a platinum-doped silicon wafer. Various test materials 2 are applied to substrate 3 by methods that are already known. Numerous different test areas 2 arranged in a grid pattern on substrate 3 are produced by conventional screen printing and lithography methods.

The top side of test materials 2 is provided with a metal layer 4 as electrode 4, this layer being applied by sputtering, for example. This metal layer 4 guarantees both electric contacting of test material 2 and a comparable emission coefficient of individual test materials 2.

To test such test materials 2, an electric field in particular is applied in the area of test materials 2. A wire or spring contact (not shown in detail here) may be provided for this purpose. For testing such test materials 2, an alternating field, which is switched comparatively rapidly, is applied to test materials 2. The heating due to electric power (resistance heating) is determined here by determining the conductivity. An analyzer unit (not shown in detail) is capable of compensating this heating of test materials 2 caused by resistance heating, so that only the heating which occurs due to the piezoactive property of test materials 2 can be determined.

As an alternative to this, an electrically insulating layer can be applied beneath electrode 4, i.e., between test material 2 and electrode 4, so that no electric current flows through test material 2, but instead the test material is exposed to the electric field. The electrically insulating layer may be made of aluminum oxide, for example. The electric field is generated here by electrode 4 and electrode 5, arranged above and below test material 2.

Figure 2:
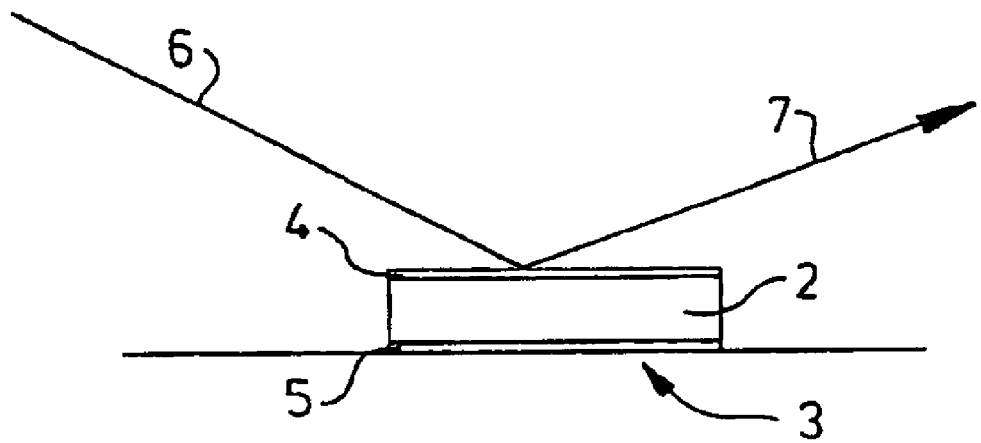
FIG. 2 shows a schematic diagram of the material to be tested during a measurement of the change in length.
Figure 3:
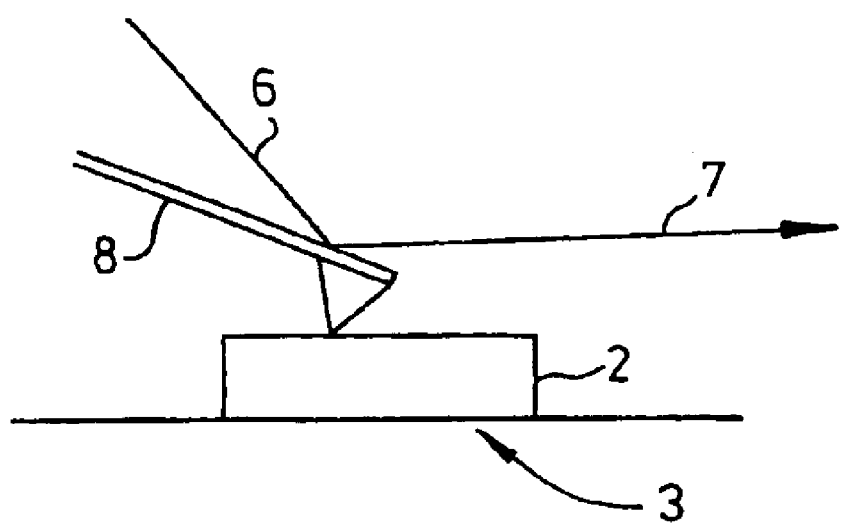
FIG. 3 shows a schematic diagram of the material to be tested during a second measurement of the change in length.

In the embodiment of the present invention mentioned last, upper electrode 4 is used in particular to reflect a beam of light or a laser beam 6 according to FIG. 2 or 3. To do so, the beam of light or laser beam 6 is directed at a predetermined angle at materials 2 to be tested, deflecting the reflected laser beam or beam of light 7 differently, depending on the length of test materials 2. The reflection is analyzed by photodiodes, for example, mounted on a wall at the side (in a manner not described in greater detail here).

In contrast with FIG. 2, FIG. 3 shows a cantilever spring 8 for determining the length extent of test material 2. Such cantilever springs 8 are known from AFM microscopy, for example.

The photograph is preferably made by using IR thermal camera 1 in parallel with the surface of test materials 2. In this way, the size extent of test materials 2 in particular can be determined and optionally analyzed by a suitable analyzer unit. It is also conceivable for IR thermal camera 1 to be designed so that it can be arranged at a certain angle with respect to substrate 3.

LIST OF REFERENCE NUMBERS

1 IR thermal camera
2 test material
3 substrate
4 electrode
5 electrode
6 beam of light
7 beam of light
8 cantilever spring

What is claimed is:

1. A device for testing a material that changes shape when at least one of an electric field and a magnetic field is applied, comprising:
   a generator for generating at least one of the electric field and the magnetic field and applying the at least one of the electric field and the magnetic field to the material;
   at least one thermal sensor for detecting a change in temperature of the material associated with the at least one of the electric field and the magnetic field; and
   a measurement unit for measuring a change in shape of the material after the at least one of the electric field and the magnetic field is applied.

2. The device according to claim 1, wherein:
   the material includes a piezoactive material.

3. The device according to claim 1, wherein:
   the at least one thermal sensor includes a radiation detector for detecting electromagnetic radiation.

4. The device according to claim 1, wherein:
   the at least one thermal sensor has a local resolution.

5. The device according to claim 1, wherein the measurement unit includes an optical measurement unit for measuring a change in at least one of a shape and a length of the material.

6. The device according to claim 1, wherein the at least one thermal sensor includes a non-optical thermal sensor.

7. The device according to claim 1, wherein the material includes a ceramic material.

8. The device according to claim 1, wherein the material includes a plastic material.

9. A device according to claim 1, further comprising:
   an imaging unit for obtaining an image of the material.

10. The device according to claim 9, wherein the imaging unit includes at least one of a photographic unit and a camera unit.

11. The device according to claim 1, wherein:
    an electric contacting is arranged on the material.

12. The device according to claim 11, wherein the electric contacting includes at least one of a layer of metal sputter and a layer of metal arranged on a layer of glue.

13. The device according to claim 1, wherein:
    the material is arranged on a substrate.

14. The device according to claim 13, further comprising:
    at least two different test areas arranged on the substrate, the at least two different test areas including different materials.

15. The device according to claim 13, further comprising:
    a plurality of different test areas are arranged in a grid pattern on the substrate.

16. The device according to claim 13, wherein the substrate includes aluminum oxide.

17. The device according to claim 13, wherein the substrate is a platinum-doped silicon wafer.

18. The device according to claim 13, further comprising:
    an arrangement for performing a temperature control of the substrate.

19. The device according to claim 18, wherein the arrangement for performing a temperature control of the substrate includes at least one of a climate chamber, a heating device, and a cooling device.

20. A device for testing a material that changes shape when at least one of an electric and a magnetic field is applied, comprising:
    a generator for generating at least one of the electric field and the magnetic field and applying the at least one of the electric field and the magnetic field to the material;
    at least one thermal sensor for detecting a change in temperature of the material associated with the at least one of the electric field and the magnetic field;
    a measurement unit for measuring a change in shape of the material after the at least one of the electric field and the magnetic field is applied; and
    a unit for varying at least one of the electric field and the magnetic field generated by the generator.

21. A device for testing a material that changes shape when at least one of an electric and a magnetic field is applied, comprising:
    a generator for generating at least one of the electric field and the magnetic field and applying the at least one of the electric field and the magnetic field to the material;
    at least one thermal sensor for detecting a change in temperature of the material associated with the at least one of the electric field and the magnetic field;
    a measurement unit for measuring a change in shape of the material after the at least one of the electric field and the magnetic field is applied; and
    a unit for periodically varying at least one of the electric field and the magnetic field generated by the generator.

22. The device according to claim 21, wherein the at least one of the electric field and the magnetic field varies periodically as one of a sinusoidal change and a square-wave change.

23. A device for testing a material that changes shape when at least one of an electric and a magnetic field is applied, comprising:
    a generator for generating at least one of the electric field and the magnetic field and applying the at least one of the electric field and the magnetic field to the material;
    at least one thermal sensor for detecting a change in temperature of the material associated with the at least one of the electric field and the magnetic field;
    a measurement unit for measuring a change in shape of the material after the at least one of the electric field and the magnetic field is applied; and
    a detection unit for detecting a portion of a heating of the material attributed to an electric current associated with the at least one of the electric field and the magnetic field.

24. The device according to claim 23, further comprising:
    an analyzer unit for compensating a temperature increase detected by the at least one thermal sensor, in the material, with the portion of the heating of the material attributed to the electric current.

* * * * *